United States Patent [19]
Glovatsky et al.

[11] Patent Number: 5,920,462
[45] Date of Patent: Jul. 6, 1999

[54] HEAT SPREADER MOUNTING PAD CONFIGURATIONS FOR LASER SOLDERING

[75] Inventors: Andrew Zachary Glovatsky, Livonia; Jay DeAvis Baker, W. Bloomfield; Peter Joseph Sinkunas, Canton, all of Mich.

[73] Assignee: Ford Motor Company, Dearborn, Mich.

[21] Appl. No.: 09/058,128

[22] Filed: Apr. 10, 1998

[51] Int. Cl.$^6$ ....................................................... H05K 7/02
[52] U.S. Cl. ........................... 361/760; 361/702; 361/704; 361/761; 361/767; 174/16.3; 174/252; 165/80.2; 165/80.3
[58] Field of Search ..................... 361/688, 702, 361/704, 712, 714, 760, 761, 767; 165/80.3; 174/16.3, 252

[56] References Cited

U.S. PATENT DOCUMENTS

| | | |
|---|---|---|
| 4,760,948 | 8/1988 | Spiecker . |
| 4,926,022 | 5/1990 | Freedman . |
| 5,019,941 | 5/1991 | Craft ......................................... 361/704 |
| 5,221,038 | 6/1993 | Melton et al. . |
| 5,229,916 | 7/1993 | Frankeny et al. . |
| 5,315,070 | 5/1994 | Maiwald ................................. 361/760 |
| 5,339,218 | 8/1994 | Veeck ...................................... 361/707 |
| 5,495,089 | 2/1996 | Freedman et al. . |
| 5,504,652 | 4/1996 | Foster et al. . |
| 5,598,321 | 1/1997 | Mostafazadeh et al. . |
| 5,729,439 | 3/1998 | Saito ....................................... 361/760 |
| 5,764,488 | 6/1998 | Silva et al. ............................... 361/760 |
| 5,842,275 | 12/1998 | McMillan, II et al. .................. 174/262 |

*Primary Examiner*—Leo P. Picard
*Assistant Examiner*—Boris L. Chervinsky
*Attorney, Agent, or Firm*—Leslie C. Hodges

[57] ABSTRACT

There is disclosed herein a printed circuit board onto which an electronic component heat spreader may be soldered by laser soldering, one embodiment of which comprises: a dielectric substrate 10 having a top surface 11 on which a footprint perimeter P of the component heat spreader is defined, and two or more heat spreader mounting pads 20 arranged on the substrate top surface 12. Each mounting pad 20 comprises a first portion 21 arranged on the substrate surface 12 outside of the footprint perimeter P, and a second portion 22 arranged on the substrate surface 12 inside of the footprint perimeter P contiguous with the first portion 21.

20 Claims, 6 Drawing Sheets

HEAT SPREADER MOUNTING PAD CONFIGURATIONS FOR LASER SOLDERING

BACKGROUND OF THE INVENTION

1. Field of the Invention

The present invention relates generally to laser soldering. More particularly, the present invention relates to mounting pad configurations for attaching electronic surface mount components to substrates using laser soldering.

2. Disclosure Information

Surface mount electronic components are typically attached to a printed circuit board (PCB) substrate by reflow soldering. In this process, (1) the mounting pads on the PCB are solder pasted, followed by (2) placement of the component atop the PCB with the component's terminations registered atop their respective solder-pasted mounting pads, followed by (3) sending the assembly through a reflow oven in which the solder paste is melted and allowed to cool so as to form solid solder joints connecting each component termination with its respective mounting pad.

An alternative to reflow processing is laser soldering, particularly diode laser soldering. Diode laser soldering is particularly useful when the substrate is molded from a low-melting-point polymer, such as polyethylene or polypropylene, because the diode laser frequency (typically 900–950 nm) is such that the laser energy is easily absorbed by metals, such as solder, but only negligibly absorbed by plastics, such as the substrate. Like reflow soldering, laser soldering includes the steps of solder pasting the PCB mounting pads and placing the component with its terminations resting atop their respective pasted pads. However, instead of sending the PCB through a reflow oven, laser soldering involves directing one or more laser beams at the pads and/or terminations in order to heat up and melt the solder to form the solder joints.

FIGS. 1 and 2 show two typical applications of laser soldering according to the prior art (and according to U.S. Pat. No. 4,926,022 to Freedman, in particular), involving a surface mount component 50 having terminations 54 thereon, and a PCB substrate 10 with mounting pads 12 on the top surface 11 thereof. The conventional practice for laser soldering is to either (1) configure the mounting pads 12 to be approximately the same size and shape as would be the case for reflow soldering and to direct the laser beam onto the termination 54 as it rests atop its mounting pad 12, as illustrated in FIG. 1, or (2) size the mounting pad 12 so as to include a portion 13 extended outward beyond the normal pad size used in either reflow processing or (1) above, so that the laser beam may be directed onto the extended portion 13 rather than directly onto the component terminations 54, as shown in FIG. 2. The advantage of utilizing the latter process is that the laser only indirectly heats the component termination (via conduction through the pad 12 and solder), thereby reducing the likelihood of damaging the component.

If this process were applied to components 50 which have a heat spreader 52 on the bottom surface thereof, such as a DPAK, D2PAK, or D3PAK, a configuration such as that illustrated in FIG. 3 would result. As shown, each termination mounting pad 12 and heat spreader mounting pad 20 would have a respective extended portion 13/25 onto which the laser beam B may be directed. Although the prior art approach of lasing the extension 13 may be effective for the relatively small termination pad 12, the heat spreader mounting pad 20 and extension 25 are so large and thermally massive that a considerable amount of laser energy is required to get enough heat to the solder paste underneath the heat spreader 52 in order to melt it and form a solder joint bonding the spreader 52 to the pad 20. The large amount of laser energy needed to form the heat spreader solder joint in the configuration shown may be so large as to deform, distort, stress, melt, degrade, or otherwise deleteriously affect the underlying substrate 10, especially if low-melting-point polymers are used to construct the substrate.

It would be desirable, therefore, to provide a way of laser soldering components having heat spreaders thereunder in such a way that the underlying substrate is not exposed to high levels of potentially damaging heat.

SUMMARY OF THE INVENTION

The present invention overcomes the disadvantages of the prior art approaches by providing a PCB onto which an electronic component heat spreader may be soldered by laser soldering without the drawbacks discussed above. One embodiment of the invention comprises: a dielectric substrate having a top surface on which a footprint perimeter of the component heat spreader is defined, and two or more heat spreader mounting pads arranged on the top surface. Each mounting pad comprises a first portion arranged on the substrate surface outside of the footprint perimeter, and a second portion arranged on the substrate surface inside of the footprint perimeter contiguous with the first portion.

It is an object and advantage that the present invention provides a mounting pad structure and method for laser soldering heat spreaders to their mounting pads in a way that significantly reduces the amount of heat transferred into the underlying substrate, thus avoiding potential damage to the substrate.

Another advantage is that the present invention provides a means for safely funneling away the gasses and effluents released from the solder paste during laser soldering, so that outgassing-related problems such as component decentering are reduced.

Yet another advantage is that the present invention may be easily, inexpensively, and reliably implemented using existing equipment and processing technologies.

These and other advantages, features and objects of the invention will become apparent from the drawings, detailed description and claims which follow.

DETAILED DESCRIPTION OF THE PREFERRED EMBODIMENTS

Figure 1:
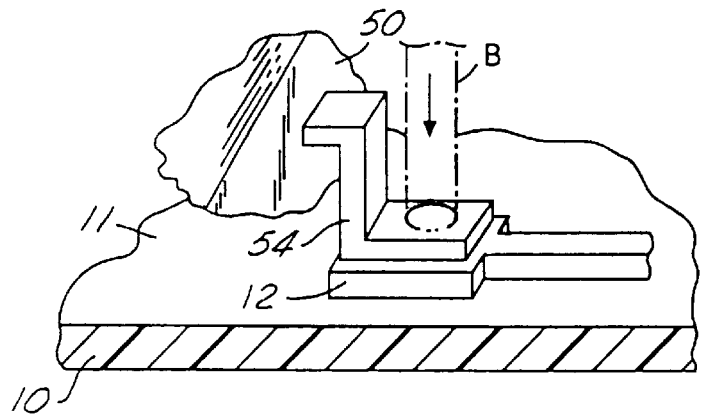
FIGS. 1 and 2 are perspective views of a component on a PCB mounting pad for laser soldering according to two prior art approaches.
Figure 2:
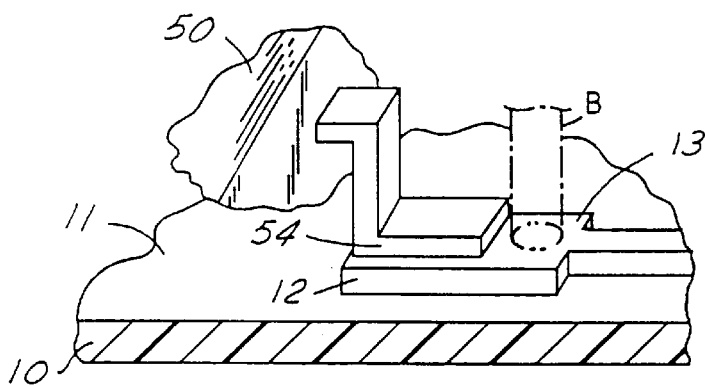
Figure 3:
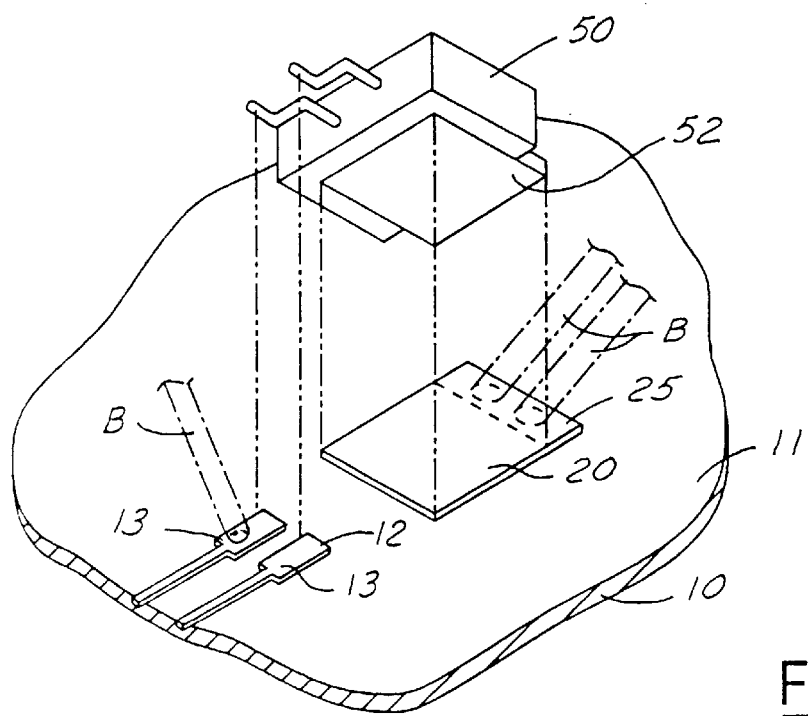
FIG. 3 is a perspective view of a component having a heat spreader on the bottom surface thereof, such as a DPAK, along with its mounting pads and heat spreader pad, according to the prior art.

Referring now to the drawings, FIGS. 4–8 show a printed circuit board onto which the heat spreader of an electronic component may be soldered by laser soldering according to a first embodiment of the present invention. The PCB comprises: a dielectric substrate 10 having a top surface 11 on which a footprint F of the component heat spreader 52 is defined, and a plurality of heat spreader mounting pads 20 arranged on the top surface 11. The heat spreader footprint F has a perimeter P thereabout. (In FIG. 4, for example, the footprint F is represented by the diagonally hatched rectangle within the dashed rectangular perimeter P.) Each mounting pad 20 comprises a first portion 21 arranged on the top surface 11 outside of the footprint perimeter P, and a second portion 22 arranged on the top surface 11 inside of the footprint perimeter P contiguous with the first portion 21, as illustrated in the drawings.

Figure 4:
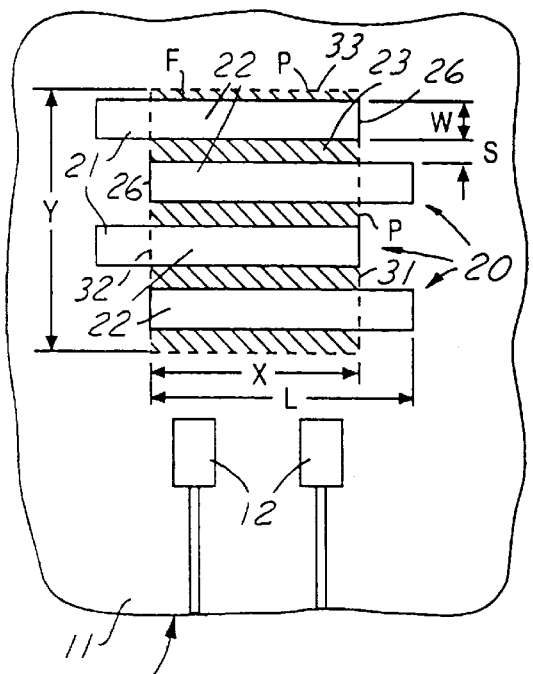
FIGS. 4–8 are plan views of various heat spreader mounting pad configurations on a PCB for laser soldering according to a first embodiment of the present invention.
Figure 5:
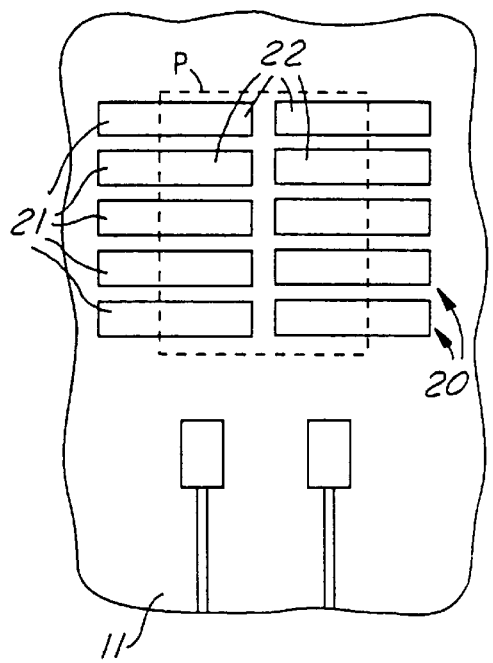
Figure 7:
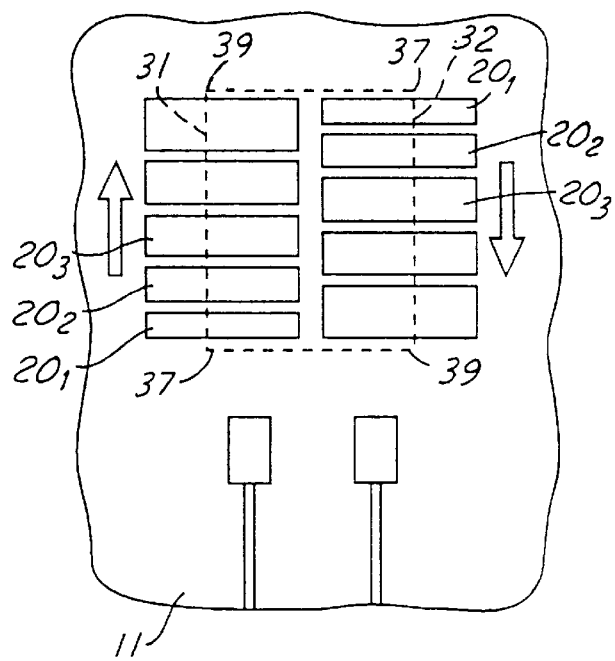

To assist the reader in understanding the present invention, all reference numbers used herein are summarized in the table below, along with the elements they represent:

10=Substrate
11=Top surface of substrate
12=Termination mounting pad
13=Extended portion of termination mounting pad
20=Heat spreader mounting pad
21=First portion of mounting pad (outside footprint)
22=Second portion of mounting pad (inside footprint)
23=Channel between adjacent second portions
24=Vias in second portion of mounting pad
25=Extended portion of heat spreader mounting pad
26=End of mounting pad second portion
27=Non-solderable central region of mounting pad
31=One of two opposing sides of perimeter
32=Other of two opposing sides of perimeter
33=Side adjacent/orthogonal to two opposing sides
37=First end of each of the two opposing edges
39=Second end of each of the two opposing edges
50=Electronic component
52=Heat spreader of electronic component
54=Termination of electronic component
B=Beam of soldering laser
F=Footprint of component heat spreader
L=Length of mounting pad
N=Number of mounting pads per footprint
P=Perimeter of footprint
S=Spacing between adjacent second portions
W=Width of mounting pad/second portion
X=Width of heat spreader footprint
Y=Length of heat spreader footprint Unlike prior art heat spreader mounting pad configurations which provide a single pad per heat spreader, the present invention utilizes a plurality of mounting pads per heat spreader. As illustrated in FIG. 4, each mounting pad 20 (and particularly each second portion 21) preferably has a generally uniform width of at least W, with each mounting pad/second portion being spaced apart from any adjacent mounting pad/second portion by a spacing S, such that $W \geq S$. All of the mounting pads/second portions may have the same width as shown in FIGS. 4 and 5, or they may have varying widths as shown in FIG. 7; in either case, each should have a width of at least W, with each spacing S between adjacent second portions 22 defining a channel 23 therebetween. The channels 23 provide a path between adjacent pad portions 22 to assist in outgassing; i.e., gasses and other non-solder effluents and volatiles may flow out from under the heat spreader 52 along these paths or channels 23 when the solder paste is being melted and cooled. This channel feature is not taught or suggested in any prior art approach.

The specific value of W and S may vary from one heat spreader/footprint combination to another, depending on such factors as: the size and shape of the footprint; the type of solder paste used; the wattage, beam shape/beam width, and scan rate of the laser(s); the number of lasers used at a given time; the number N of mounting pads per footprint; the length(s) L and arrangement of the mounting pads; and so forth. In general, though, the value of S may be very small, on the order of 0.1 to 1.0 mm. For example, for the D2PAK footprint and pad configuration shown in FIG. 4, the following values represent one possible design:

| | |
|---|---|
| X = 7.87 mm | W = 1.00 mm |
| Y = 9.77 mm | S = 0.72 mm |
| N = 5 pads | L = 11.78 mm |

Figure 6:
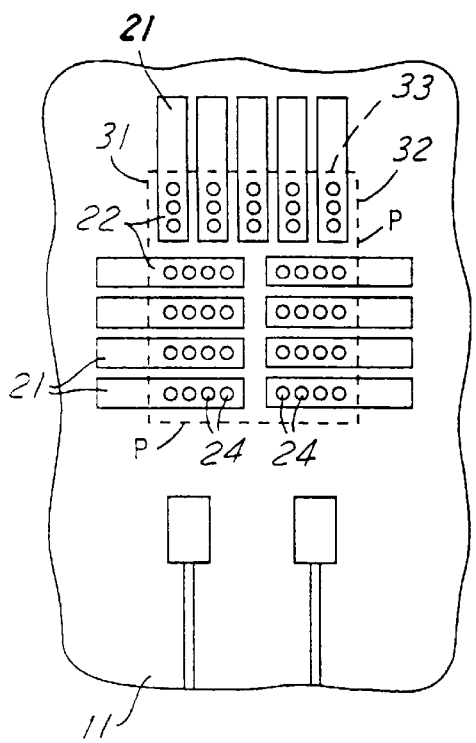
Figure 8:
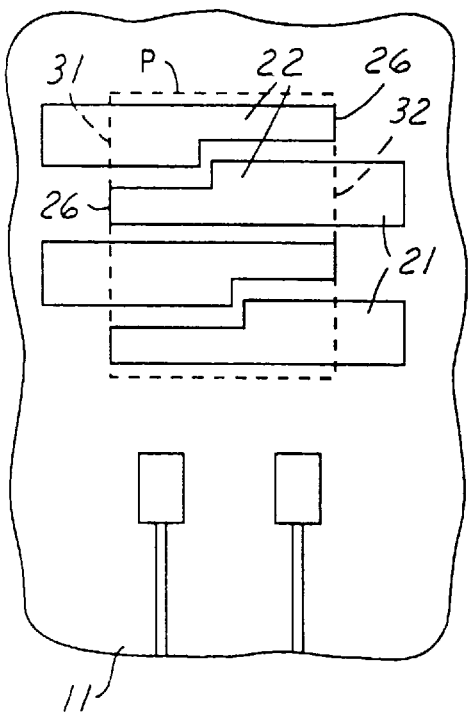

Each mounting pad 20 is preferably rectangular in shape, as shown in FIGS. 4–7, although they may also assume right polygon shapes as shown in FIG. 8, as well as other shapes. It is also preferable that the pads 20 be arranged substantially parallel to one another with a plurality of first portions 21 arranged on each of two opposing sides 31/32 of the footprint perimeter P, as shown in FIGS. 4–8. Optionally, the configuration may further include a plurality of first portions 21 arranged on a side 33 adjacent and generally orthogonal to each of the two opposing sides 31/32, as shown in FIG. 6; in this arrangement, the plurality of pads 20 are each substantially parallel or substantially orthogonal with one another.

In yet another configuration, the width of the first portions 21 arranged on each of two opposing sides 31/32 increases from a first end 37 of each edge 31/32 to a second end 39 of each edge, as illustrated in FIG 7. This arrangement may be used when not all of the first portions 21 on a side 31/32 are being lased at the same time (e.g., the laser beam is swept from one end 37 to another 39). This configuration takes into account the thermal energy being transmitted by the heated pad into the substrate, and thence into the adjacent (next-to-be-lased) pad. For example, if the laser is directed initially to only the first pad $20_1$ at one edge 37/39, by the time sufficient laser energy has been directed thereto to melt the solder paste atop the pad $20_1$ heat will have propagated through the surrounding substrate 10 and have begun heating the next pad $20_2$. Thus, if the second pad $20_2$ has the same width as the first $20_1$, the second $20_2$ would not require as long a lase time to melt its solder paste as did the first pad $20_1$. The third pad $20_3$ would require even less time than the second $20_2$, and so on. If the pads 20 all have the same width W and the laser beam is directed along each footprint edge 31/32 at the same rate of travel, by the time the beam reaches the last pad along each edge, the last pad may have been exposed to too much energy (i.e., laser energy plus substrate-conducted thermal energy from adjacent heated pads). If this is the case, two corrections may be made: (1) slow down the beam rate of travel as the beam scans along each edge, or (2) progressively increase the width of each pad going from the first end 37 of the beamed edge 31/32 to the second end 39. The former correction may involve an inordinate amount of time and effort to program the laser beam travel control program to accommodate each component heat spreader; however, the latter approach is much easier to implement, and is thus the preferred approach.

Regardless of the specific shapes and orientations the mounting pads 20 assume, it is preferable that the second portions 22 and channels 23 be sized and arranged such that the combined surface area of all second portions 22 within the footprint F be at least 70% but less than 100% of the total area within the footprint perimeter.

Figure 10:
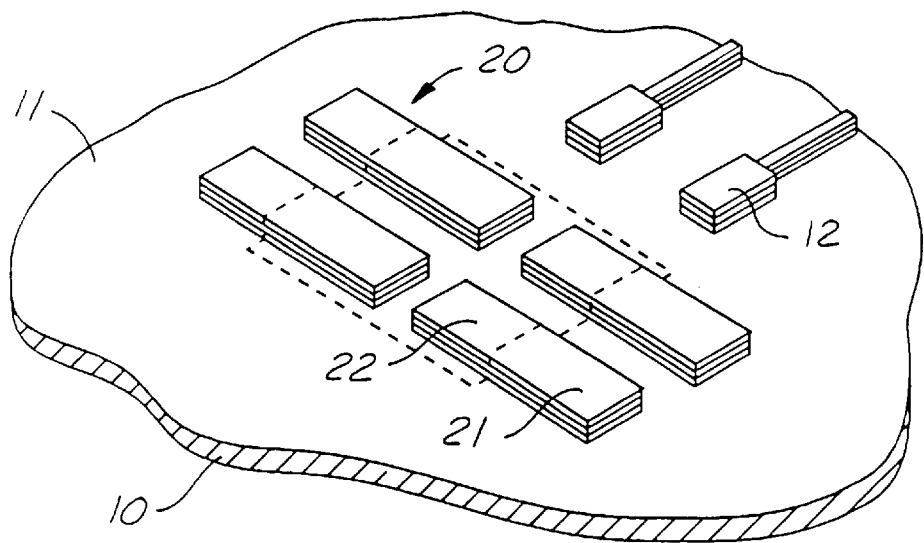
FIG. 10 is a perspective view of a mounting pad according to the present invention having a tri-metallic sandwich construction.
Figure 11:
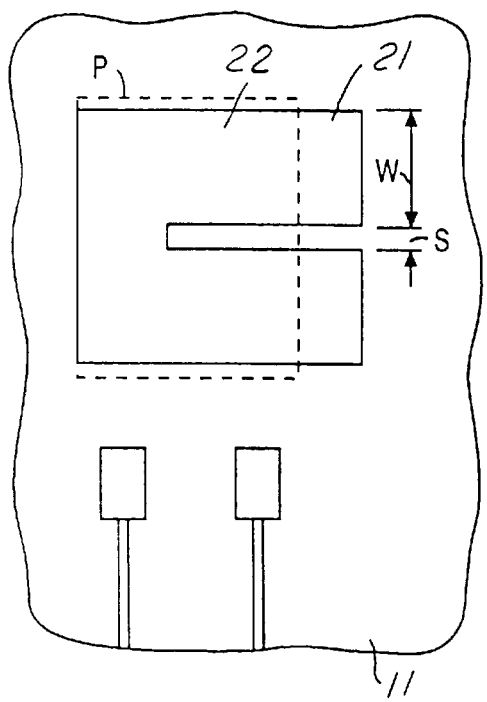
FIGS. 11–18 are plan views of various heat spreader mounting pad configurations according to a second embodiment of the present invention.
Figure 12:
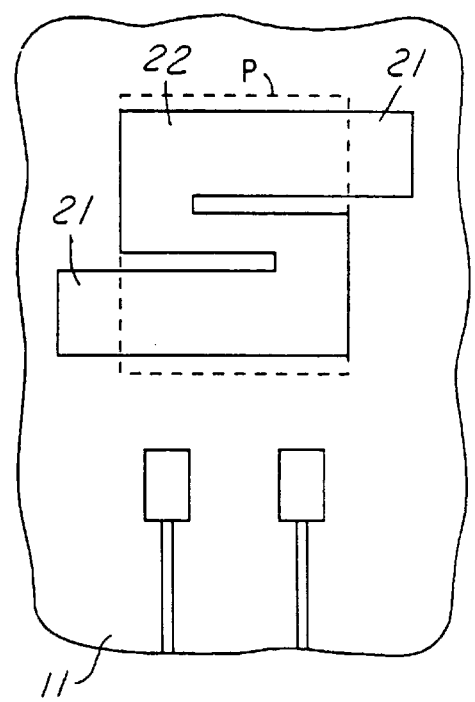
Figure 13:
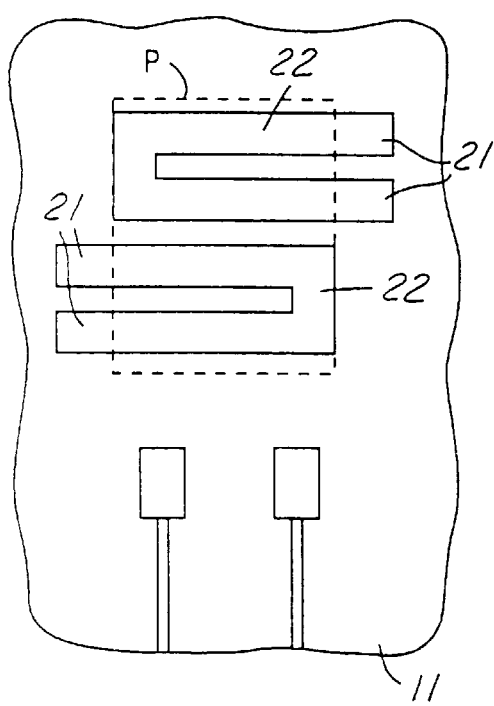
Figure 14:
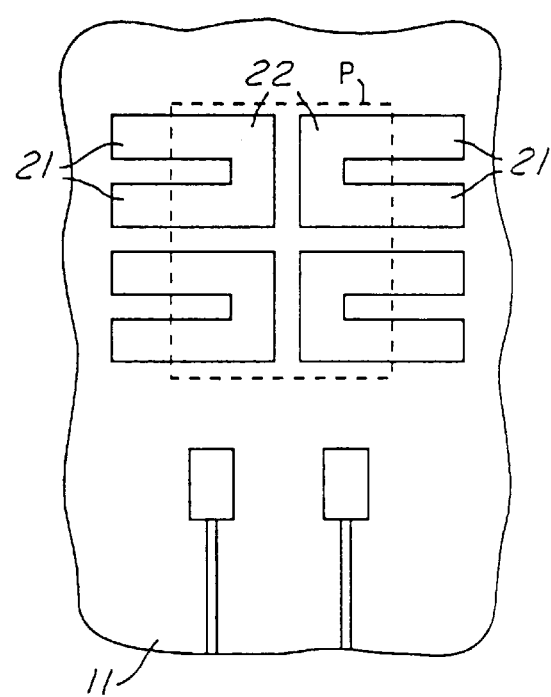
Figure 15:
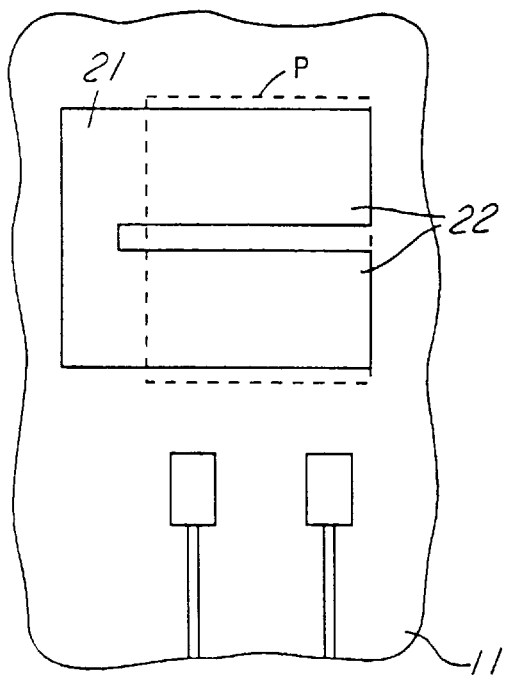
Figure 16:
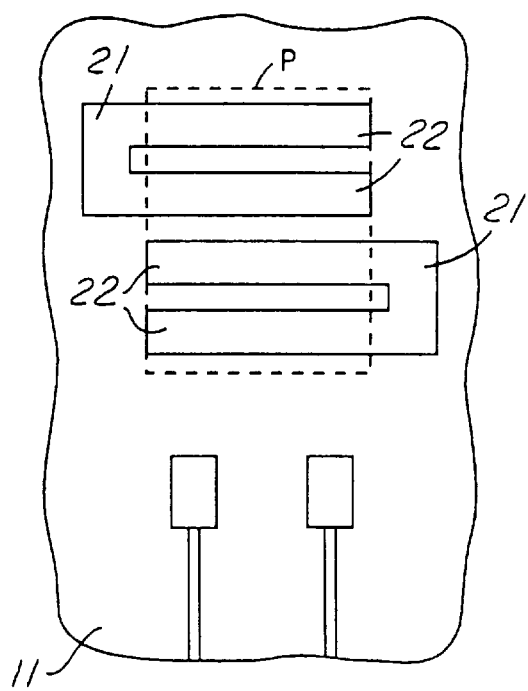
Figure 17:
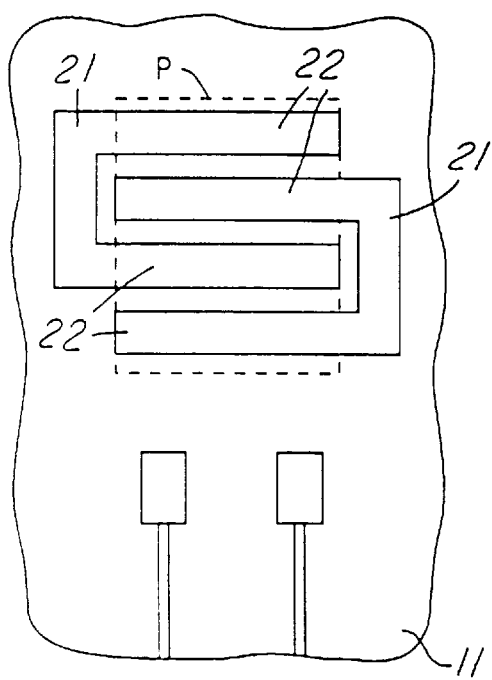
Figure 18:
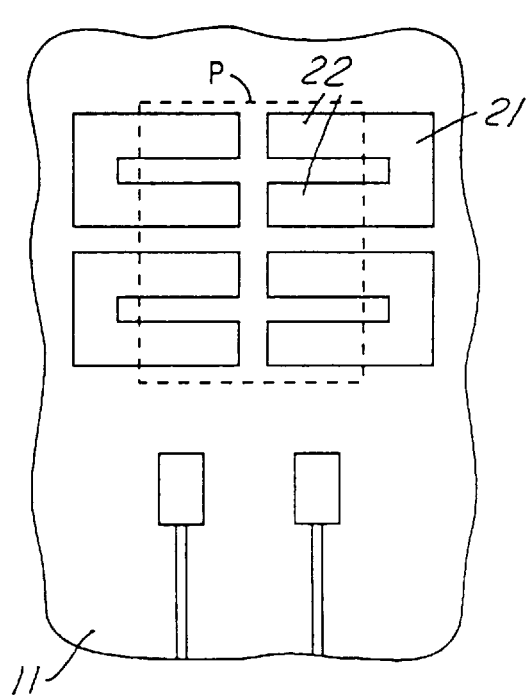

The mounting pads 20 may be constructed of conventional copper metallizations or traces, which are well known to those skilled in the art of PCB manufacture. Alternatively, the mounting pads may have a tri-metallic sandwich construction, as illustrated in FIG. 10. This construction may consist of a copper-aluminum-copper sandwich, constructed by such techniques as selective masking, plating, and etching. Also, the tri-metallic constructions may comprise one or more metals other than copper and aluminum, such as nickel, iron, gold, and so forth. Whether the mounting pads 20 comprise copper metallizations or tri-metal sandwich constructions, one or more of the second portions 22 may have vias or through-holes 24 defined therethrough, as shown in FIG. 6. When used, the vias 24 may be accompanied by corresponding vias or through-holes in the underlying substrate 10 (not shown). The mounting pad vias 24 may be included to assist in outgassing and/or in thermal transport of heat away from the heat spreader.

Figure 9:
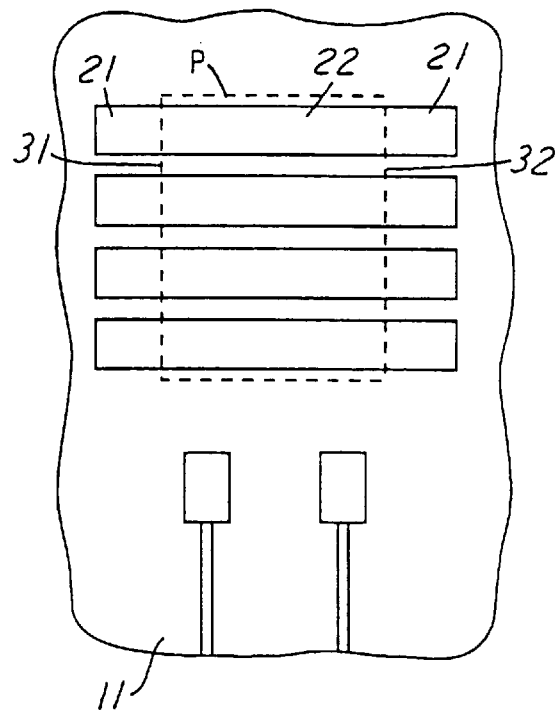
FIG. 9 is a plan view of a non-preferred mounting pad configuration.

It may be noted in FIGS. 4–8 (and particularly in FIGS. 4 and 8) that the mounting pads 20 generally do not extend beyond both sides 31/32 of the footprint perimeter P. (That is, each mounting pad 20 as described thus far will generally have only one first portion 21 and only one second portion 22.) Rather, the end of the second portion 22 not contiguous with the pad's first portion 21 preferably extends, at most, to the side 31/32 of the footprint perimeter distal from the first portion 21. This is preferred because if the mounting pads 20 did extend outside of both opposing sides 31/32 of the perimeter, as shown in FIG. 9, then the component 50 may tend to "skate" and move atop the molten solder paste such that when the solder cools, the component is unacceptably decentered, rotated, or otherwise misaligned with respect to its footprint F.

A second embodiment of the present invention is illustrated in FIGS. 11–18, in which the mounting pad 20 assumes a serpentine (i.e., generally C-shaped or S-shaped) configuration. This embodiment is similar to that heretofore described, with one exception being that instead of a plurality of typically rectangular mounting pads, only one serpentine mounting pad is needed (although more than one may certainly be used). Two versions of the present embodiment are contemplated. In the first version (illustrated by FIGS. 11–14), each serpentine mounting pad 20 comprises two substantially linear first portions 21 arranged outside the footprint perimeter P, and a generally C-shaped or S-shaped second portion 22 arranged inside the perimeter P and having two ends, wherein each end is contiguous with a respective one of the first portions 21. In the second version (illustrated in FIGS. 15–18), the mounting pad 20 comprises a generally C-shaped first portion 21 arranged outside the perimeter P and having two ends, and two second portions 22 arranged inside the perimeter, wherein each second portion 22 is contiguous with a respective one of the two ends of the first portion 21.

As illustrated in FIGS. 11–18, it is preferred that the end 26 of each second portion 22 distal from the first portion extend, at most, to the footprint perimeter P, but not beyond/outside of the perimeter; this prevents the skating and decentering problem described above. As with the former embodiment shown in FIGS. 4–8, in either version of the present serpentine embodiment each second portion 22 preferably has a generally uniform width of at least W wherein each second portion is spaced apart from any adjacent second portion by a spacing S, such that $W \geq S$ (i.e., the second portion width W is generally as great or greater than the gap S separating adjacent second portions). The combined surface area of all second portions 22 is preferably at least 70% and less than 100% of the total area within the footprint perimeter P, and the second portions 22 may optionally have vias or through-holes 24 defined therethrough. Preferably all of the second portions 22 are generally rectangular in shape and substantially parallel with one another (although, of course, recto-polygonal or other shapes, and orthogonal or other orientations, are possible as well).

Figure 19A:
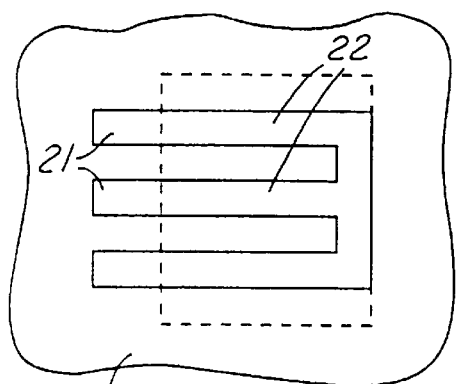
FIGS. 19A–F are plan views of heat spreader mounting pad configurations according to various alternative embodiments of the present invention.
Figure 19B:
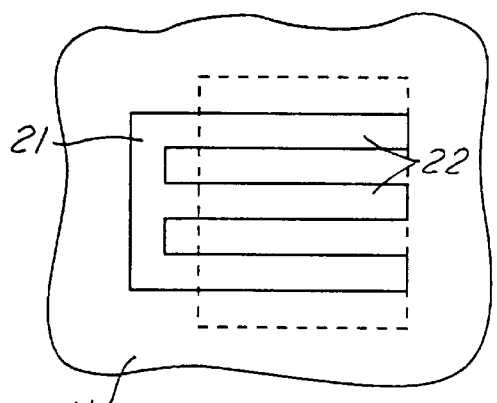
Figure 19C:
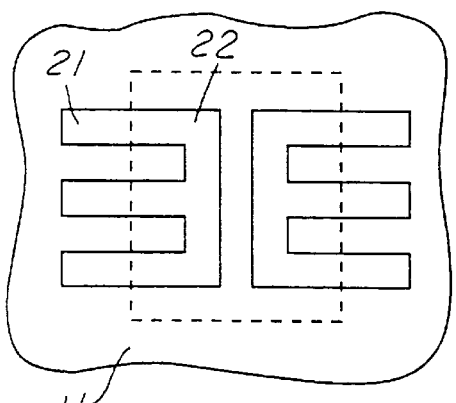
Figure 19D:
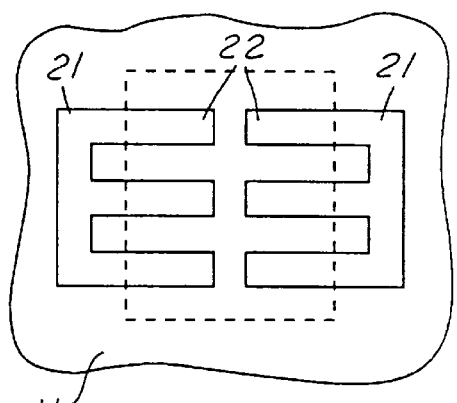
Figure 19E:
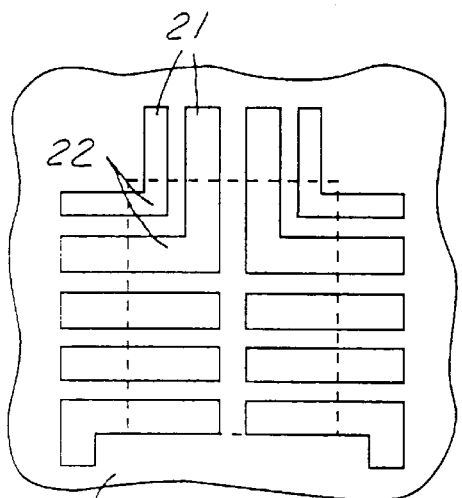
Figure 19F:
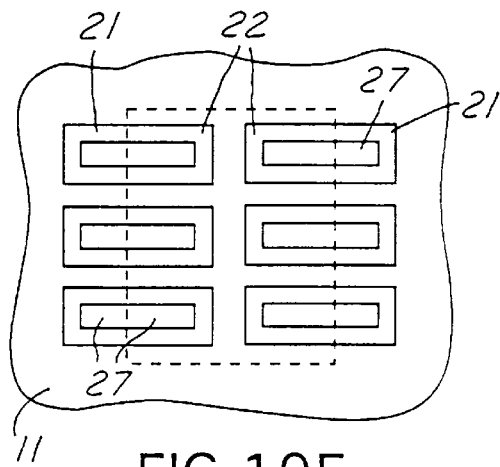

Many other heat spreader mounting pad configurations according to the present invention are possible. For example, the C-shaped first or second portion 21/22 may be modified as an E-shaped member, as shown in FIGS. 19A–D. Additionally, the pads 20 may be formed as shown in FIG. 19E, in which some of the pads are generally L-shaped, or as in FIG. 19E, wherein each pad has a non-solderable central region 27 therein. The non-solderable region 27 may be formed by placing a solder mask thereat, for example. Many other variations are likewise possible which are still within the scope of the present invention.

Various other modifications to the present invention will, no doubt, occur to those skilled in the art to which the present invention pertains. For example, although the drawings only show rectangular or recto-polygonal heat spreader mounting pads 20, it is obvious that other shapes of mounting pads are possible. It is also possible that footprint perimeter shapes other than the rectangular ones shown in the drawings are possible. Also, although the drawings show a small gap between certain perimeter edges and an adjacent mounting pad (as in edge 33 and the topmost mounting pad 20 in FIG. 4, for example), it is not necessary that such gaps be included in practicing the invention; these gaps are included in the drawings merely for clarity. Additionally, while it is generally preferable that the pad width W be as great or greater than the spacing S between adjacent pads, it may be desired to provide a spacing S greater than the pad width W, such as in configurations similar to FIGS. 5–7 where the vertical gap between the two columns of horizontal pads may be widened to a spacing greater than W. Furthermore, the configurations shown in the drawings are not exhaustive, but are merely illustrative of the wide variety of configurations possible according to the present invention. It is the following claims, including all equivalents, which define the scope of the present invention.

What is claimed is:

1. A printed circuit board onto which an electronic component heat spreader is soldered by laser soldering, comprising:

a dielectric substrate having a top surface on which a footprint perimeter of the component heat spreader is defined;

a plurality of heat spreader mounting pads arranged on said top surface, wherein each mounting pad comprises a first portion arranged on said top surface outside of the footprint perimeter, and a second portion arranged on said top surface inside of the footprint perimeter contiguous with said first portion.

2. A printed circuit board according to claim 1, wherein each mounting pad has a generally uniform width of at least W and wherein each mounting pad is spaced apart from any adjacent mounting pad by a spacing S, such that W≧S.

3. A printed circuit board according to claim 1, wherein a combined surface area of all second portions is at least 70% and less than 100% of the area within the footprint perimeter.

4. A printed circuit board according to claim 1, wherein the second portion of at least one of said mounting pads has thermal vias defined therein.

5. A printed circuit board according to claim 1, wherein each mounting pad is substantially rectangular.

6. A printed circuit board according to claim 1, wherein each mounting pad is substantially recto-polygonal.

7. A printed circuit board according to claim 1, wherein said plurality of heat spreader mounting pads are each substantially parallel with one another.

8. A printed circuit board according to claim 1, wherein said plurality of heat spreader mounting pads are each substantially parallel or substantially orthogonal with one another.

9. A printed circuit board according to claim 1, wherein each mounting pad is a single copper layer or a tri-metallic sandwich construction.

10. A printed circuit board according to claim 1, wherein a first plurality of said first portions are arranged on each of two opposing sides of the footprint perimeter.

11. A printed circuit board according to claim 10, further including a second plurality of said first portions arranged on a side of the footprint perimeter adjacent and generally orthogonal to each of said opposing sides.

12. A printed circuit board according to claim 10, wherein the width of the first portions arranged on each of the two opposing sides increases from a first end of each edge to a second end of each edge.

13. A printed circuit board onto which an electronic component heat spreader is soldered by laser soldering, comprising:

a dielectric substrate having a top surface on which a footprint perimeter of the component heat spreader is defined;

at least one serpentine heat spreader mounting pad arranged on said top surface, wherein each serpentine mounting pad comprises a generally C-shaped first portion arranged on said top surface outside of the footprint perimeter and having two ends, and two second portions arranged on said top surface inside of the footprint perimeter, wherein each second portion is contiguous with a respective one of said two ends of said first portion.

14. A printed circuit board according to claim 13, wherein each second portion has a generally uniform width of at least (W) and wherein each second portion is spaced apart from any adjacent second portion by a spacing (S), such that (W)≧(S).

15. A printed circuit board according to claim 13, wherein a combined surface area of all second portions is at least 70% and less than 100% of the area within the footprint perimeter.

16. A printed circuit board according to claim 13, wherein all of said second portions are each substantially parallel with one another.

17. A printed circuit board onto which an electronic component heat spreader is soldered by laser soldering, comprising:

a dielectric substrate having a top surface on which a footprint perimeter of the component heat spreader is defined;

at least one serpentine heat spreader mounting pad arranged on said top surface, wherein each serpentine mounting pad comprises two substantially linear first portions arranged on said top surface outside of the footprint perimeter, and a generally C-shaped or S-shaped second portion arranged on said top surface inside of the footprint perimeter and having two ends, wherein each end is contiguous with a respective one of said first portions.

18. A printed circuit board according to claim 17, wherein each second portion has a generally uniform width of at least (W) and wherein each second portion is spaced apart from any adjacent second portion by a spacing (S), such that (W)≧(S).

19. A printed circuit board according to claim 17, wherein a combined surface area of all second portions is at least 70% and less than 100% of the area within the footprint perimeter.

20. A printed circuit board according to claim 17, wherein all of said second portions are each substantially parallel with one another.

* * * * *